US012660607B2

(12) United States Patent
Sharma et al.

(10) Patent No.: US 12,660,607 B2
(45) Date of Patent: Jun. 16, 2026

(54) ULTRA-THIN SEMI-METALS FOR LOW TEMPERATURE CONDUCTION

(71) Applicant: Intel Corporation, Santa Clara, CA (US)

(72) Inventors: Abhishek Anil Sharma, Portland, OR (US); Pushkar Ranade, San Jose, CA (US); Sagar Suthram, Portland, OR (US); Wilfred Gomes, Portland, OR (US); Tahir Ghani, Portland, OR (US); Anand S. Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 17/958,283

(22) Filed: Sep. 30, 2022

(65) Prior Publication Data

US 2024/0113025 A1     Apr. 4, 2024

(51) Int. Cl.
*H10W 20/44*        (2026.01)
*H10W 20/41*        (2026.01)
*H10D 62/10*        (2025.01)

(52) U.S. Cl.
CPC ..... *H10W 20/4403* (2026.01); *H10W 20/435* (2026.01); *H10D 62/121* (2025.01)

(58) Field of Classification Search
CPC . H01L 23/528; H01L 23/5283; H01L 23/522; H01L 23/532; H01L 23/53204; H01L 23/53209; H01L 23/5226; H10W 20/4403; H10W 20/435; H10W 20/43; H10W 20/42; H10D 62/121
See application file for complete search history.

(56) References Cited

U.S. PATENT DOCUMENTS

| | | | |
|---|---|---|---|
| 2023/0014503 A1* | 1/2023 | Lin ..................... | H10W 20/033 |
| 2023/0215917 A1* | 7/2023 | Razavieh ........... | H10D 30/6728 |
| | | | 257/329 |
| 2023/0411211 A1* | 12/2023 | Li ..................... | H01L 23/53238 |

* cited by examiner

*Primary Examiner* — Wasiul Haider
(74) *Attorney, Agent, or Firm* — Schwabe, Williamson & Wyatt P.C.

(57) ABSTRACT

Embodiments disclosed herein include an integrated circuit structure. In an embodiment, the integrated circuit structure comprises an interlayer dielectric (ILD), and an opening in the ILD. In an embodiment, a first layer lines the opening, and a second layer lines the first layer. In an embodiment, the second layer comprises a semi-metal or transition metal dichalcogenide (TMD). The integrated circuit structure may further comprise a third layer over the second layer.

23 Claims, 11 Drawing Sheets

ULTRA-THIN SEMI-METALS FOR LOW TEMPERATURE CONDUCTION

TECHNICAL FIELD

Embodiments of the disclosure are in the field of semiconductor structures and processing and, in particular, to interconnect and via architectures for low temperature conduction.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multigate transistors, such as tri-gate transistors and gate-all-around (GAA) transistors, have become more prevalent as device dimensions continue to scale down. Tri-gate transistors and GAA transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Another aspect driving innovation is the drive for high bandwidth (HBW) computing.

DESCRIPTION OF THE EMBODIMENTS

Figure 1:
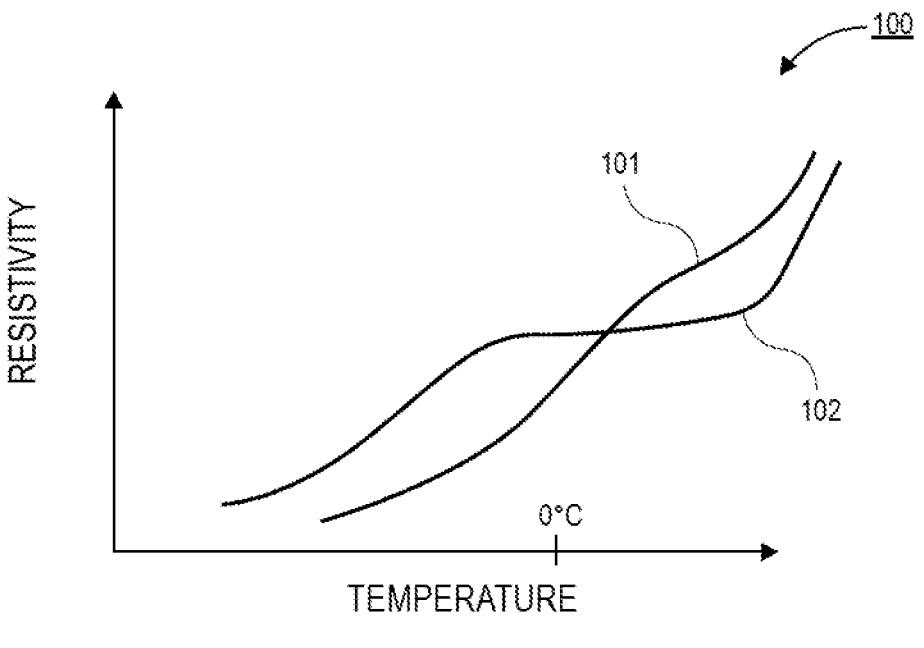
FIG. 1 is a graph of electrical conductivity versus temperature for different materials, in accordance with an embodiment.

Embodiments described herein comprise interconnect and via architectures for low temperature conduction and methods of forming such interconnects and vias. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In order to provide context, high bandwidth (HBW) computing may use low temperatures (e.g., below 0 degrees Celsius) in order to provide improved computing performance of the transistors. However, traditional interconnect materials (e.g., copper and the like) do not have high electrical conductivity at such low temperatures. As such, electrical performance and efficiency of computing systems operating at such temperatures is diminished. Accordingly, embodiments disclosed herein include hybrid interconnect architectures that leverage the low temperature electrical conductivity of semi-metal or transition metal dichalcogenides (TMDs). A graph of the electrical conductivity versus temperature for generic classes of materials is shown in FIG. 1. As shown, the bulk metal materials 101 typically have a high conductivity at temperatures above 0 degrees Celsius, but quickly reduce in conductivity below 0 degrees Celsius. In contrast semi-metal or TMD materials 102 have electrical conductivity that is lower than the bulk metals above 0 degrees Celsius, but higher electrical conductivity than the bulk metals below 0 degrees Celsius.

In a particular embodiment, one or more thin low temperature layers are embedded in the bulk metal. As used herein, low temperature layers may include semi-metal or TMD materials. Such an architecture allows for adequate electrical conduction at the low temperatures, while the bulk metal provides the necessary electrical conduction at higher temperatures. As such, the computing system can be operated at standard temperatures or at low temperatures for HBW computing. In some instances the semi-metal or TMD material may occupy between approximately 10% and 20% of the volume of the interconnect.

Figure 2A:
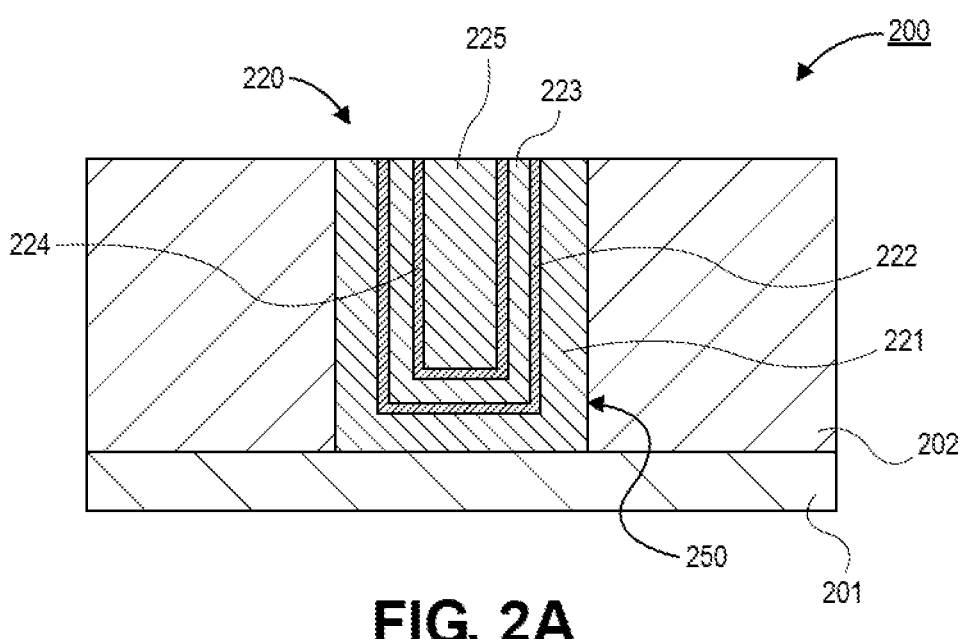
FIG. 2A is a cross-sectional illustration of a hybrid interconnect with a pair of low temperature conduction material layers, in accordance with an embodiment.

Referring now to FIG. 2A, a cross-sectional illustration of an integrated circuit (IC) structure 200 is shown, in accordance with an embodiment. In an embodiment, the IC structure 200 comprises interlayer dielectrics (ILDs) 201 and 202. In an embodiment, as used throughout the present description, ILD material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The ILD material may be formed by techniques, such as, for example, chemical vapor deposition (CVD), physical vapor deposition (PVD), or by other deposition methods.

In an embodiment, an opening 250 is provided through the ILD 202. An interconnect 220 may be provided in the opening 250. The interconnect 220 may be any type of interconnect suitable for use in an IC structure 200. For example, the interconnect 220 may be a trace, a pad, a via, or the like. The interconnect 220 may be provided in a backside region or a front-side region of the IC structure 200. That is, the interconnect 220 may be provided above or below a device layer that includes transistors (not shown). Additionally, the interconnect 220 may be provided in any of the metal layers within an IC structure 200.

In an embodiment, the interconnect 220 may be a hybrid interconnect 220. A hybrid interconnect 220 may refer to an interconnect 220 that comprises two or more different material compositions. For example, the hybrid interconnect 220 may include a first layer 221, a second layer 222, a third layer 223, a fourth layer 224, and a fifth layer 225. The second layer 222 and the fourth layer 224 may be low temperature layers, and the first layer 221, the third layer 223, and the fifth layer 225 may be bulk conductive materials. In a particular embodiment, the second layer 222 and the fourth layer 224 may comprise a semi-metal or a TMD. For example, the TMD may comprise a transition metal (e.g., molybdenum, tungsten, etc.) and a chalcogen (e.g., sulfur, selenium, tellurium, etc.). More generally, 2D or TMD materials may comprise sulphides, tellurides and selenides of Mo, W, Hf, Ti, Ta, Cu, Mo, Ni, Nb, Si, Ge, In, Zn, Sn, Sb, etc., black phosphorus, graphene, and carbon nanotubes. In an embodiment, the bulk conductive materials may comprise an element that is also included in the semi-metal or TMD of the second layer 222 and the fourth layer 224. For example, the first layer 221, the third layer 222, and the fifth layer 225 may include a transition metal such as, molybdenum or tungsten. Accordingly, the semi-metal or TMD materials may be formed with a process that partially consumes the first layer 221 or the third layer 223, as will be described in greater detail below.

In an embodiment, the first layer 221 through the fourth layer 224 are formed with conformal processes. As such, the first layer 221 through the fourth layer 224 may include U-shaped cross-sections. Each of the layers 221-224 may include a substantially flat bottom surface and arms that extend up the sidewalls of the opening 250. Since the layers 221-224 are conformal, any deviation in the shape of the opening 250 may be transferred to the shape of the layers 221-224. For example, if the sidewalls of the opening 250 are angled (i.e., not orthogonal to surfaces of the ILDs 202 and 201), then the arms of the layers 221-224 may also be angled. In an embodiment, the fifth layer 225 may be a plug that fills a remainder of the opening 250. That is, the fifth layer 225 may not have a U-shaped cross-section in some embodiments.

In an embodiment, the low temperature conduction layers 222 and 224 may have a relatively small thickness. For example, thicknesses of the second layer 222 and the fourth layer 224 may be approximately 2 nm or less. In some embodiments, the second layer 222 and the fourth layer 224 may have a thickness that is equal to a single monolayer of the material (e.g., approximately 0.5 nm or less). The first layer 221, the third layer 223, and the fifth layer 225 may have relatively large thicknesses. For example, thicknesses of the first layer 221, the third layer 223, and the fifth layer 225 may be between approximately 1 nm and approximately 50 nm. In an embodiment, a volume percentage of the low temperature conduction material in the second layer 222 and the fourth layer 224 may be approximately 10% to approximately 20% of the volume of the interconnect 220. As used herein, "approximately" may refer to a range of values within ten percent of the stated value. For example, approximately 1 nm may refer to a range between 0.9 nm and 1.1 nm.

In FIG. 2A, the first layer 221, the third layer 223, and the fifth layer 225 are all the same material. Similarly, the second layer 222 and the fourth layer 224 may also be the same material. However, it is to be appreciated that embodiments are not limited to such configurations.

Figure 2B:
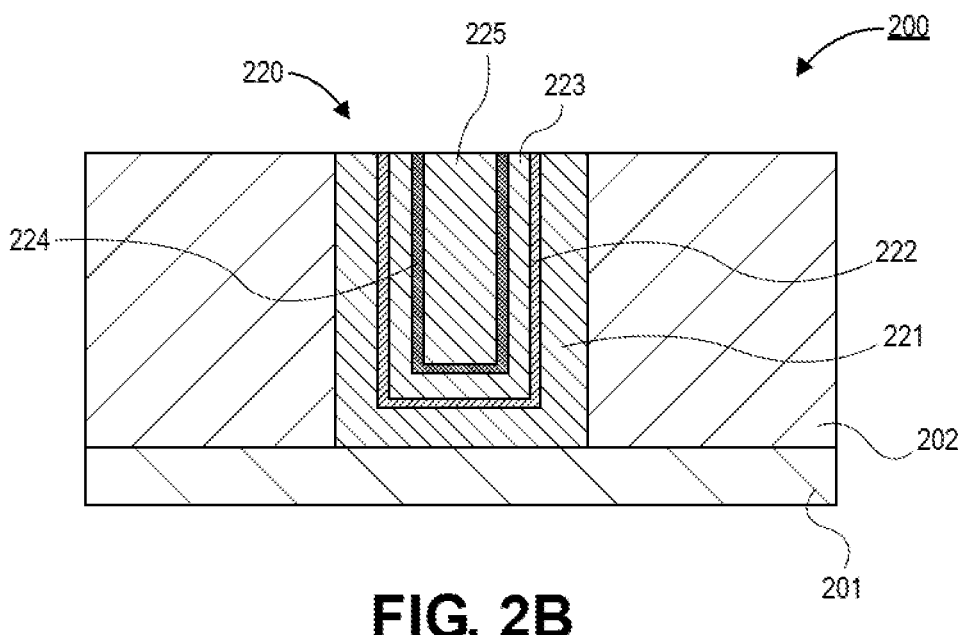
FIG. 2B is a cross-sectional illustration of a hybrid interconnect with a pair of low temperature conduction material layers that are different from each other, in accordance with an embodiment.

Referring now to FIG. 2B, a cross-sectional illustration of an IC structure 200 is shown, in accordance with an additional embodiment. In an embodiment, the IC structure 200 may be substantially similar to the IC structure 200 shown in FIG. 2A, with the exception of the material composition of the second layer 222 and the fourth layer 224. Instead of being the same material, the second layer 222 and the fourth layer 224 may have different material compositions. For example, the second layer 222 may comprise tungsten and sulfur, and the fourth layer 224 may comprise tungsten and selenium. While the transition metal is the same for both layers in the previous example, in other embodiments, the transition metal may be different between the second layer 222 and the fourth layer 224. In such an embodiment, the first layer 221 and the third layer 223 may comprise different materials as well. For example, the first layer 221 may comprise tungsten and the third layer 223 may comprise molybdenum.

Figure 2C:
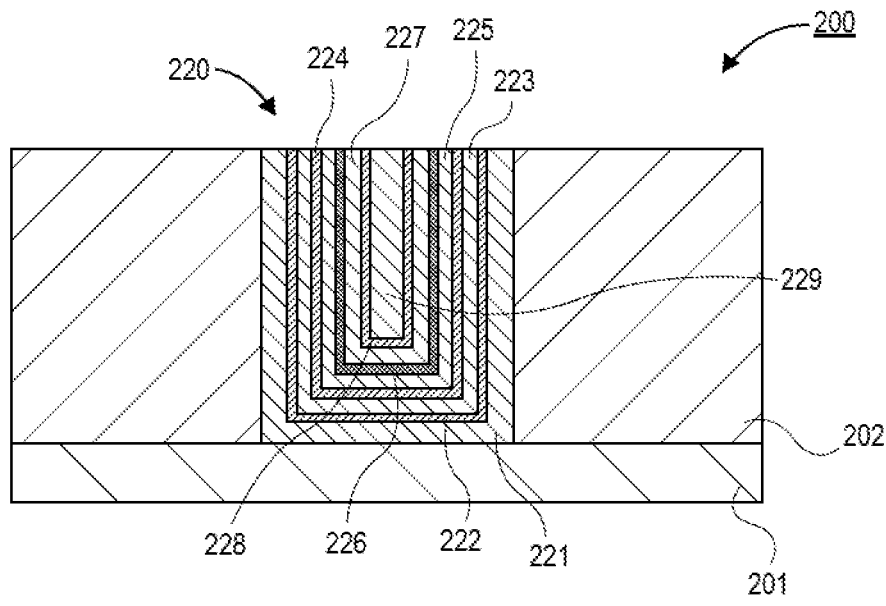
FIG. 2C is a cross-sectional illustration of a hybrid interconnect with a plurality of low temperature conduction material layers, in accordance with an embodiment.

Referring now to FIG. 2C, a cross-sectional illustration of an IC structure 200 is shown, in accordance with an embodiment. As shown, more than two low temperature conduction layers may be included in the interconnect 220. For example, low temperature conduction layers may be formed in the second layer 222, the fourth layer 224, the sixth layer 226, and the eighth layer 228. Bulk conductive material may be provided in the first layer 221, the third layer 223, the fifth layer 225, the seventh layer 227, and the ninth layer 229. While four low temperature conduction layers are shown, it is to be appreciated that there may be any number of low temperature conduction layers (e.g., one or more).

Additionally, the low temperature conduction layers 222, 224, 226, and 228 may include two or more different materials. For example, the second layer 222, the fourth layer 224, and the eighth layer 228 comprise a first material, and the sixth layer 226 comprises a second material that is different than the first material. Furthermore, while two different materials are shown, it is to be appreciated that a single material may be used for all four layers 222, 224, 226, and 228, or two or more materials may be used for the four layers 222, 224, 226, and 228. The different materials may also be arranged in any pattern. For example, the second layer 222 and the sixth layer 226 may comprise a first material, and the fourth layer 224 and the eighth layer 228 may comprise a second material. While the bulk conductive layers (e.g., first layer 221, third layer 223, fifth layer 225, seventh layer 227, and ninth layer 229) are shown as having a single material, it is to be appreciated that the bulk conductive layers may also include two or more different material compositions.

Figure 3:
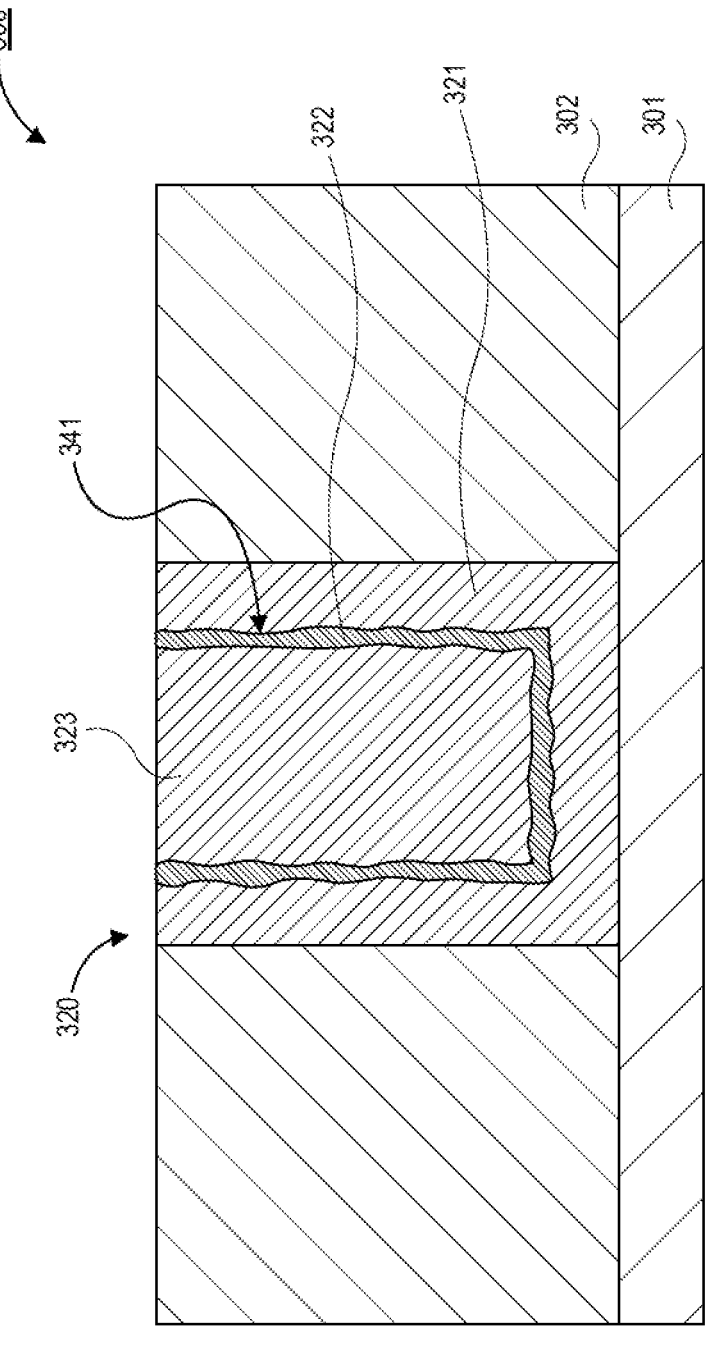
FIG. 3 is a cross-sectional illustration of a hybrid interconnect with a low temperature conduction material layer, in accordance with an embodiment.

Referring now to FIG. 3, a cross-sectional illustration of an IC structure 300 is shown, in accordance with an embodiment. In the illustrated embodiment, an interconnect 320 is provided in ILDs 301 and 302. The interconnect 320 may be a trace, a pad, a via, or the like. As shown, the interconnect 320 includes a first layer 321, a second layer 322, and a third layer 323. The first layer 321 and the third layer 323 may comprise a bulk conductive material, and the second layer 322 may comprise a low temperature conduction material, such as a semi-metal or a TMD. The second layer 322 may be embedded in the interconnect 320 between the first layer 321 and the third layer 323. The second layer 322 may have a substantially U-shaped cross-section. However, in contrast to the embodiments described above, the second layer 322 may have wavy or otherwise non-planar surfaces 341. The undulation of the surfaces 341 may be the result of the methods to form the second layer 322. For example, portions of the first layer 321 may be consumed during the formation of the second layer 322. The consumption of the first layer 321 may not proceed at a constant rate across the interface, which may result in a slightly undulating surface when examining the second layer 322 at a high magnification. That is, at lower magnifications, the interface between the first layer 321 and the second layer 322 may appear linear, and at higher magnifications, the undulation may become apparent. Additionally, while a single low temperature conduction material (i.e., the second layer 322) is shown, it is to be appreciated that multiple low temperature conduction layers may be used, similar to any of the embodiments described in greater detail above.

Referring now to FIGS. 4A-4F, a series of cross-sectional illustrations depicting a process for forming an IC structure 400 is shown, in accordance with an embodiment. The IC structure 400 may be substantially similar to the IC structure 200 shown in FIG. 2A. Though, it is to be appreciated that IC structures with alternative architectures may be formed by modifying one or more of the operations described herein, as those skilled in the art will appreciate.

Figure 4A:
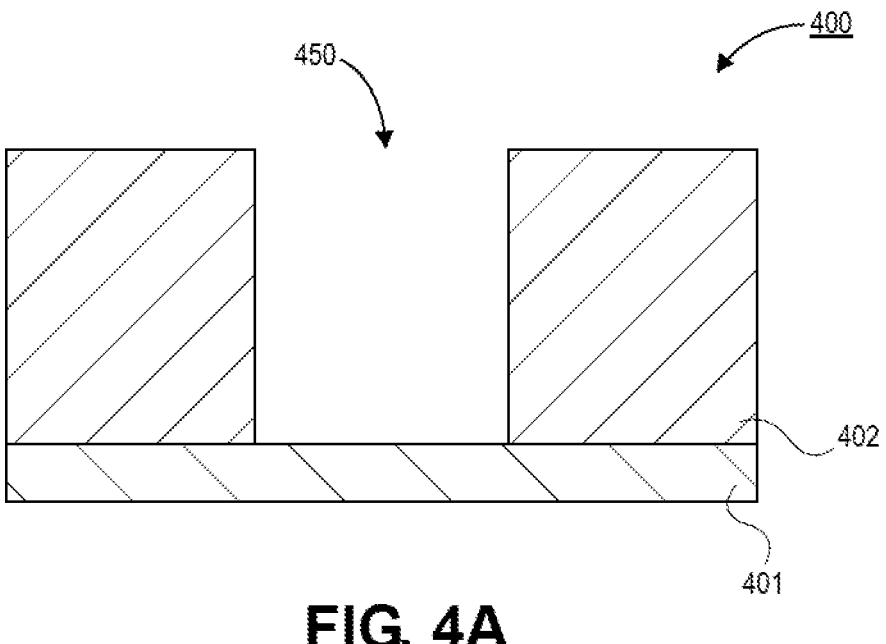
FIGS. 4A-4F are cross-sectional illustrations depicting a process for forming a hybrid interconnect with low temperature conduction material layers, in accordance with an embodiment.

Referring now to FIG. 4A, a cross-sectional illustration of an IC structure 400 at a stage of manufacture is shown, in accordance with an embodiment. In an embodiment, the IC structure 400 may include one or more ILDs 401 and 402. In the illustrated embodiment, an opening 450 passes through a thickness of the ILD 402. However, in other embodiments, the opening 450 may pass partially through the thickness of the ILD 402, or the opening 450 may also extend into the ILD 401. The opening 450 may be formed with any suitable patterning operation common to semiconductor manufacturing processes. For example, an etching process with a mask layer may be used to form the opening 450.

Figure 4B:
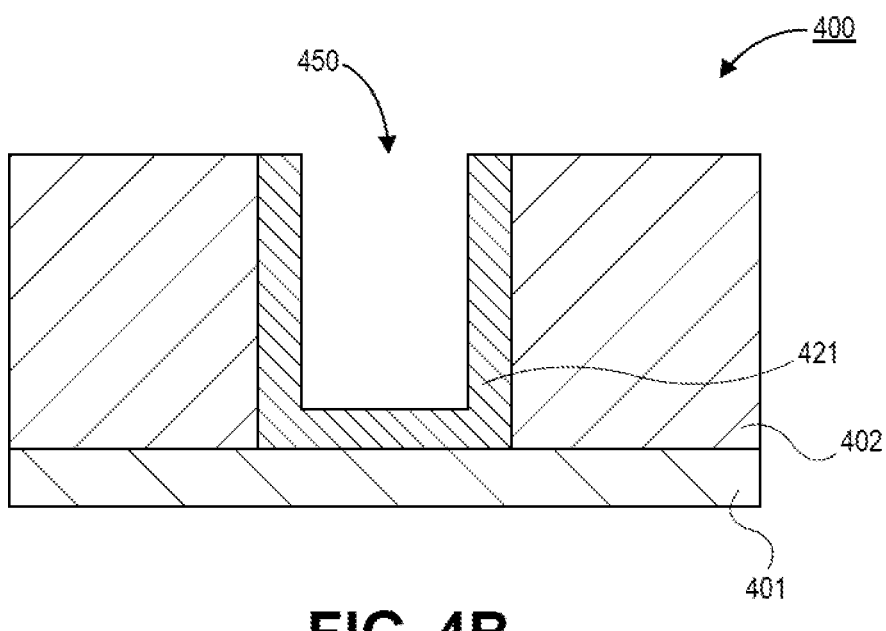

Referring now to FIG. 4B, a cross-sectional illustration of the IC structure 400 after a first layer 421 is formed is shown, in accordance with an embodiment. In an embodiment, the first layer 421 may be formed with any suitable material deposition process. For example, the first layer 421 may be deposited with an atomic layer deposition (ALD) process, a chemical vapor deposition (CVD) process, a physical vapor deposition (PVD) process, or the like. In a particular embodiment, the first layer 421 is deposited with a conformal deposition process. As such, the first layer 421 may conform to the sidewalls of the opening 450. The first layer 421 may have a substantially U-shaped cross-section in some embodiments. A thickness of the first layer 421 may be approximately 50 nm or less. In some embodiments, the thickness of the first layer 421 may be as small as approximately 1 nm. In an embodiment, the first layer 421 may be a bulk conductive material. That is, the first layer 421 may be a material that is suitable for conducting electricity at relatively high temperatures (e.g., approximately 0 degrees Celsius or more). The first layer 421 may be a transition metal, such as tungsten or molybdenum.

Figure 4C:
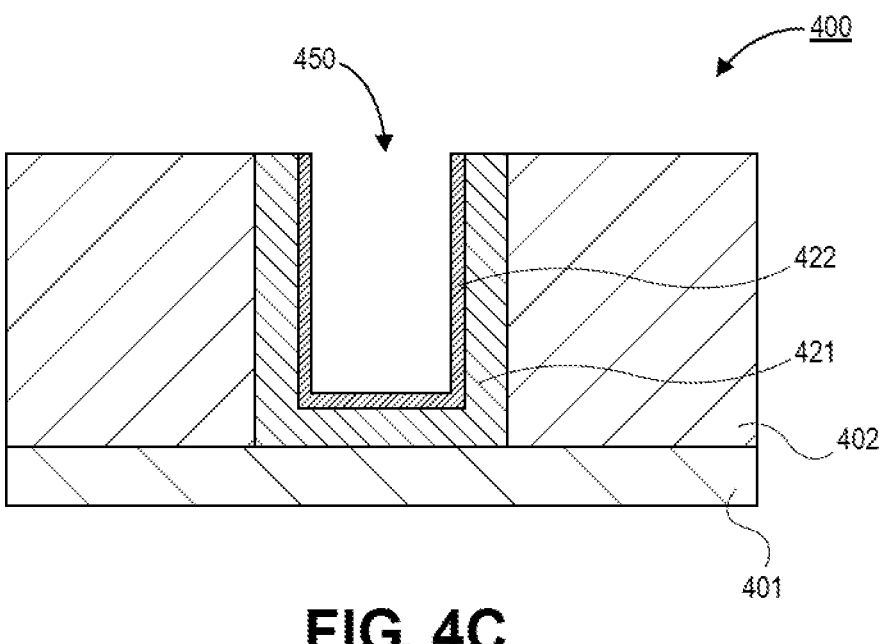

Referring now to FIG. 4C, a cross-sectional illustration of the IC structure 400 after a second layer 422 is formed is shown, in accordance with an embodiment. In an embodiment, the second layer 422 is formed with a process that involves a conversion of the exposed surface of the first layer 421. For example, a chalcogenide (e.g., sulfur, selenium, tellurium, etc.) may be flown over the first layer 421. The conversion may result in the formation of a TMD material or a semi-metal for the second layer 422. The second layer 422 may have a thickness as small as a single monolayer and up to approximately 2 nm. The second layer 422 may be a material suitable for low temperature electrical conduction. For example, the second layer 422 may have good electrical conduction at temperatures below approximately 0 degrees Celsius. In an embodiment, the second layer 422 may also have a U-shaped cross-section that is conformal to the first layer 421.

Figure 4D:
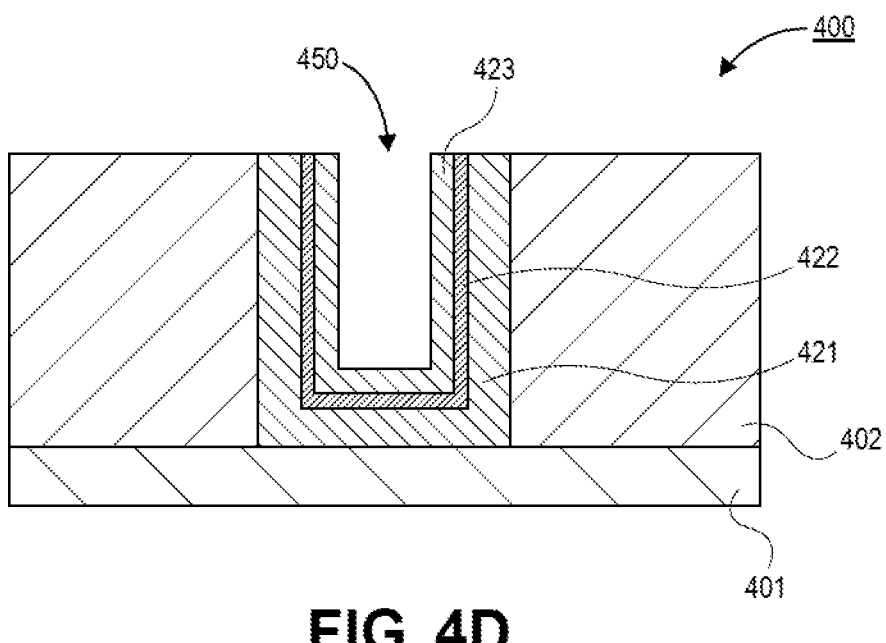

Referring now to FIG. 4D, a cross-sectional illustration of the IC structure 400 after a third layer 423 is formed is shown, in accordance with an embodiment. The third layer 423 may be a bulk conductive material. The third layer 423 may be the same material as the first layer 421. In other embodiments, the third layer 423 may be a different material than the first layer 421. The thickness of the third layer 423 may be between approximately 1 nm and approximately 50 nm. The third layer 423 may be deposited with any suitable deposition process (e.g., ALD, CVD, PVD, or the like). In an embodiment, the third layer 423 may also have a U-shaped cross-section.

Figure 4E:
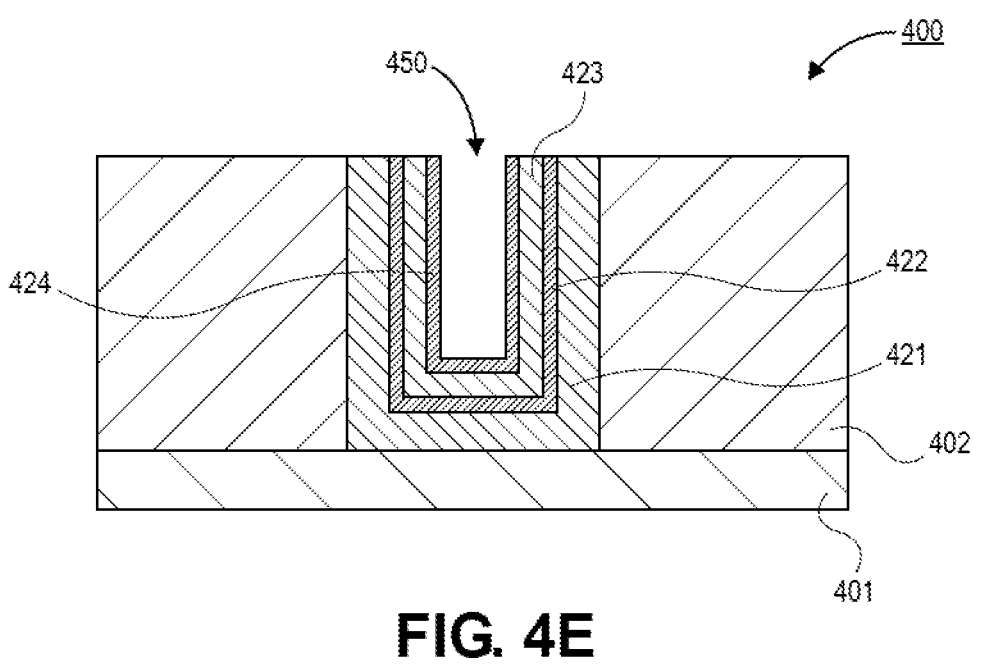

Referring now to FIG. 4E, a cross-sectional illustration of the IC structure 400 after a fourth layer 424 is formed is shown, in accordance with an embodiment. The fourth layer 424 may be a low temperature conduction material. For example, the fourth layer 424 may comprise a TMD or a semi-metal. The fourth layer 424 may be the same material as the second layer 422. In other embodiments, the fourth layer 424 may be a different material than the second layer 422. In an embodiment, the fourth layer 424 may be formed by flowing a chalcogenide over the third layer 423, resulting in a conversion of a portion of the third layer 423. In an embodiment, the fourth layer 424 may have a U-shaped cross-section with a thickness between approximately 0.4 nm and approximately 2 nm.

Figure 4F:
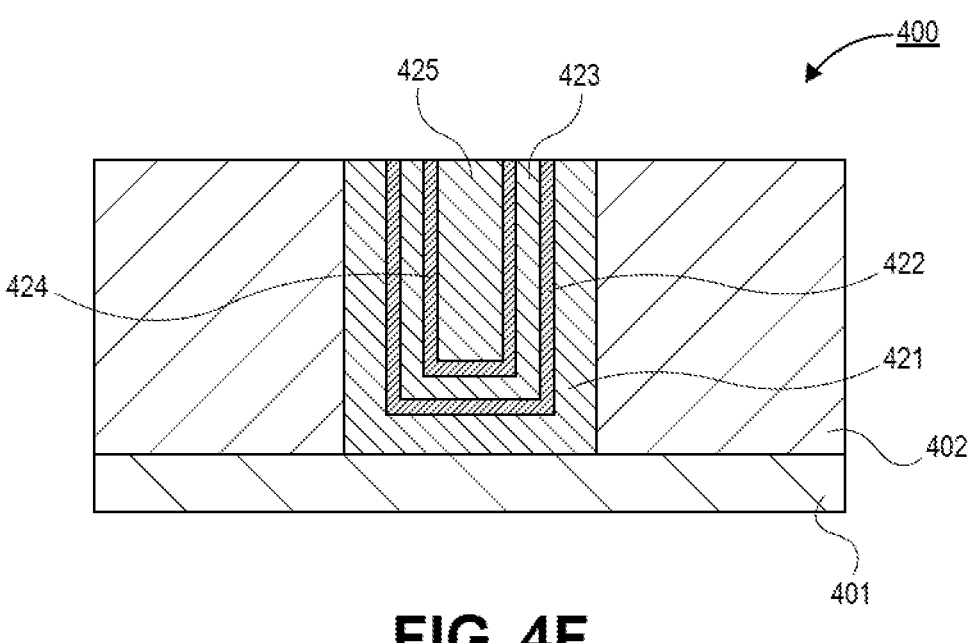

Referring now to FIG. 4F, a cross-sectional illustration of the IC structure 400 after a fifth layer 425 is formed is shown, in accordance with an embodiment. In an embodiment, the fifth layer 425 may fill a remainder of the opening 450. For example, the fifth layer 425 may be a plug that fills the remainder of the opening 450. That is, the fifth layer 425 may have a rectangular cross-section. The fifth layer 425 may comprise the same material as the first layer 421 or the third layer 423. In other embodiments, the fifth layer 425 may be a different material than the first layer 421 and the third layer 423. The fifth layer 425 may be deposited with any suitable deposition process (e.g., ALD, CVD, PVD, etc.).

In the embodiments described above, an interconnect is shown in isolation of the remainder of the IC structure. Particularly, it is to be appreciated that the hybrid interconnects may be positioned at any location of the IC structure. For example, the hybrid interconnects may be provided on a front-side or a backside (i.e., above or below transistors) of the IC structure. Additionally, the hybrid interconnect may be used in any metal layer of the IC structure. In some embodiments, portions of the electrical routing may include hybrid interconnect structures, or substantially all of the electrical routing may include hybrid interconnect structures.

Figure 5:
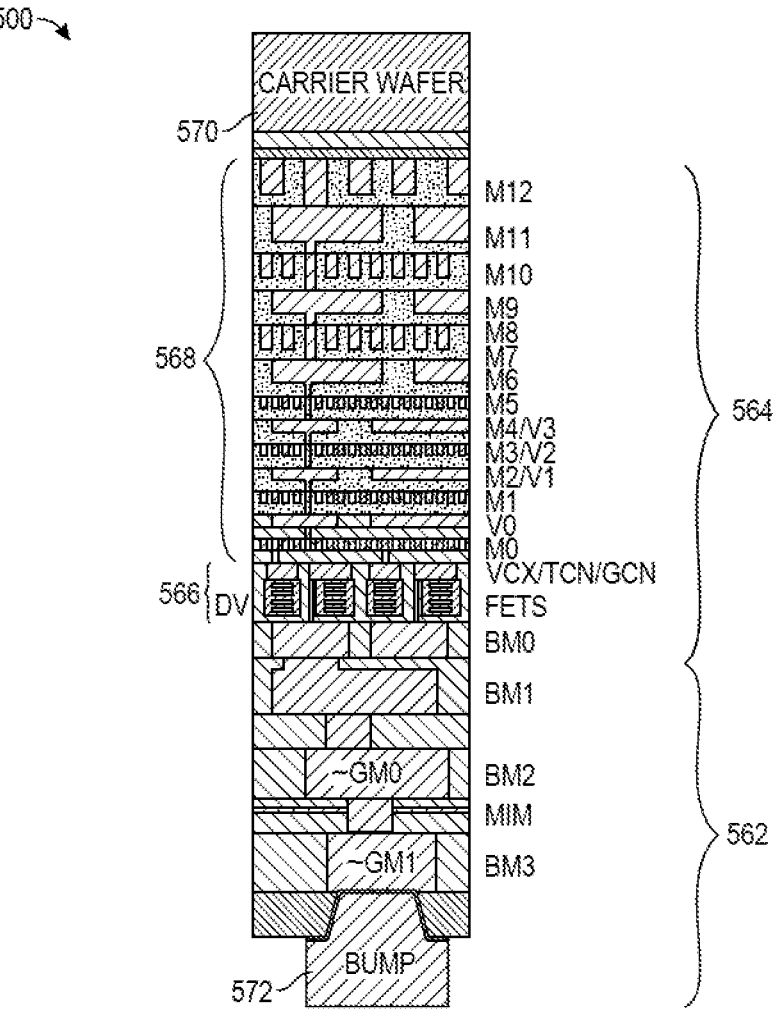
FIG. 5 is a cross-sectional illustration of an integrated circuit structure having a nanowire memory layer and backside power delivery, in accordance with an embodiment.

As an exemplary IC structure including signal lines as front-end lines and power structures in a backside, FIG. 5 illustrates a cross-sectional view of an IC structure having a nanowire memory layer and backside power delivery, in accordance with an embodiment of the present disclosure. It is to be appreciated that although nanowires (or nanoribbons or nanosheets) are depicted in FIG. 5, a fin-based architecture can also be used. In accordance with an embodiment of the present disclosure, energy consumption by the structure of FIG. 5 can be further reduced by using a low temperature conductive material such as described above in association with FIGS. 1-4F for one or more of the conductive lines, features or structures described below in association with FIG. 5.

Referring to FIG. 5, an IC structure 500 includes a front-side structure 564 on a backside structure 562. The front-side structure 564 includes a device layer 566, and a plurality of metallization layers 568 on the device layer 566. The structure 500 may be supported by a carrier wafer 570 on the front-side structure 564. The backside structure 562 includes a stack of backside conductive structures that terminate at a conductive bump 572.

In an embodiment, the device layer 566 includes Field Effect Transistors (FETs), such as nanowire-based (shown) or fin-based transistors. In one such embodiment, the FETs are used for memory. In an embodiment, the device layer 566 further includes trench contacts (TCN), gate contacts (GCN) and contact vias (VCX). In an embodiment, the device layer 566 is on a deep via (DV) layer of the front-side structure 564, as is depicted. In an embodiment, the plurality of metallization layers 568 includes increasing metal layer (e.g., M0-M12) and associated via layers (e.g., V0-V3 called out in FIG. 5).

In an embodiment, the backside structure 562 includes a plurality of backside metal layers (e.g., BM0-BM3) and associated vias. In an embodiment, the backside structure 562 includes one or more power structures, such as ground metal lines (e.g., GM0 and GM1). In an embodiment, the backside structure 562 includes one or more capacitor structures, such as a metal-insulator-metal (MIM) capacitor.

Figure 6:
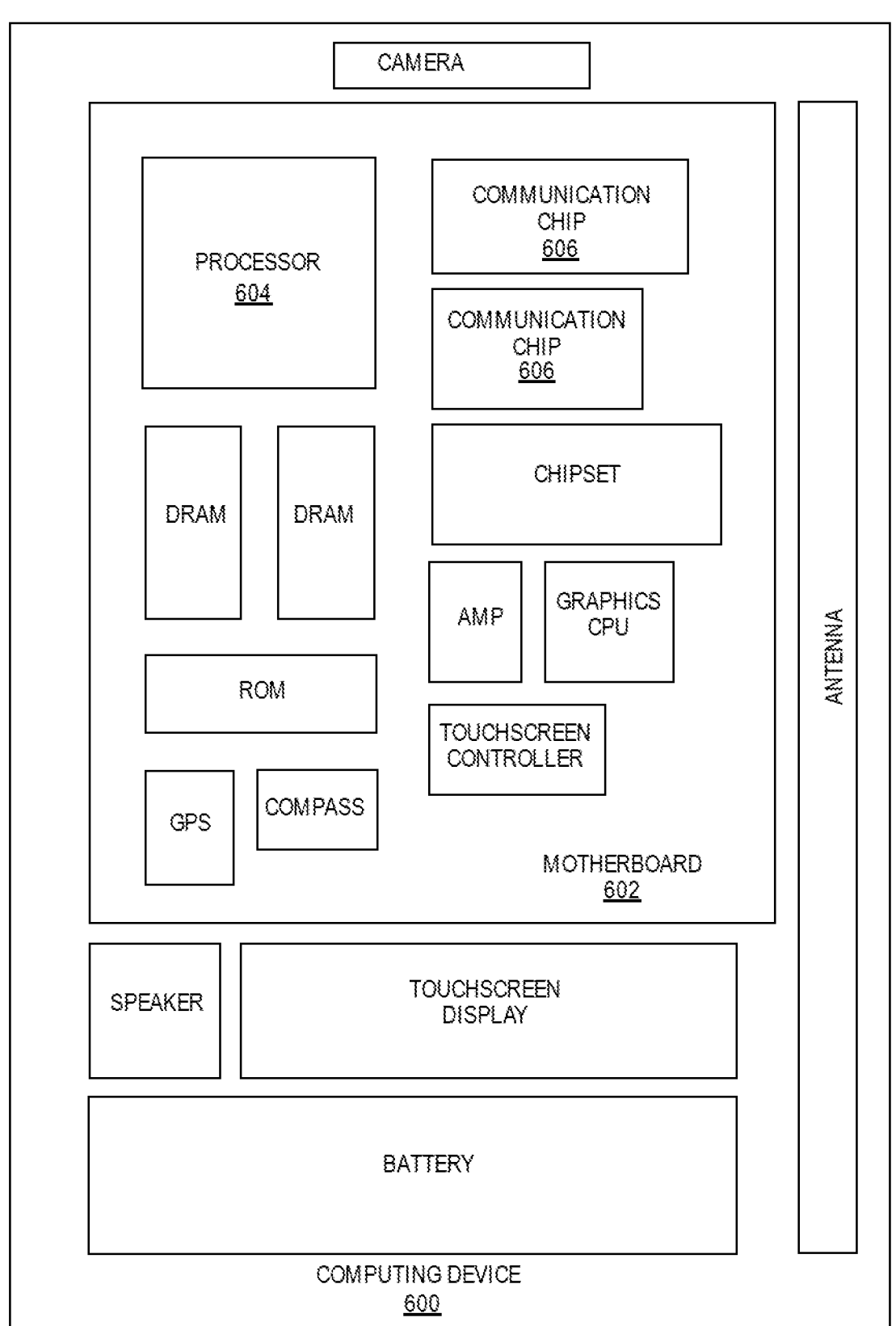
FIG. 6 illustrates a computing device in accordance with one implementation of an embodiment of the disclosure.

FIG. 6 illustrates a computing device 600 in accordance with one implementation of an embodiment of the present disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The integrated circuit die of the processor 604 may include one or more structures, such as gate-all-around integrated circuit structures having hybrid interconnect architectures, built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. The integrated circuit die of the communication chip 606 may include one or more structures, such as gate-all-around integrated circuit structures having hybrid interconnect architectures, built in accordance with implementations of embodiments of the present disclosure.

In further implementations, another component housed within the computing device 600 may contain an integrated circuit die that includes one or structures, such as gate-all-around integrated circuit structures having hybrid interconnect architectures, built in accordance with implementations of embodiments of the present disclosure.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
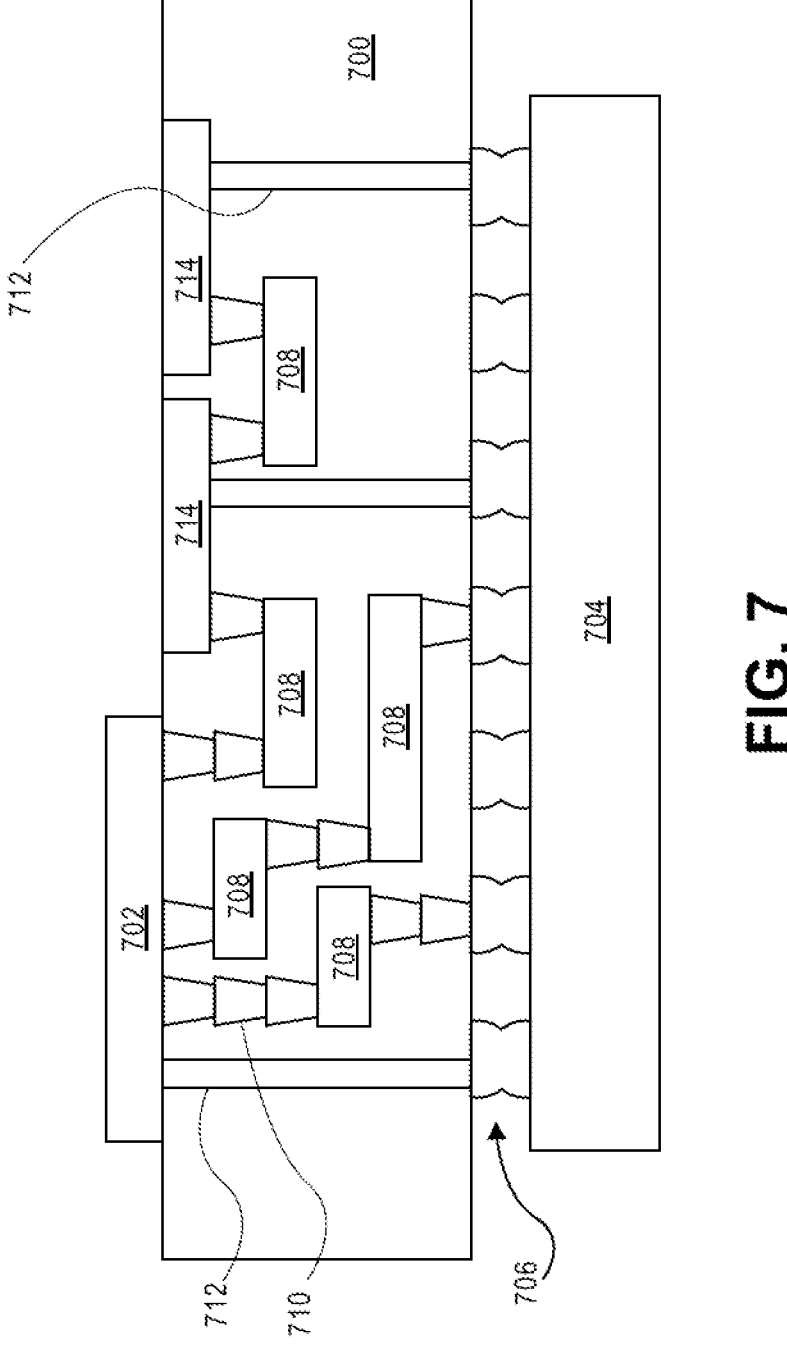
FIG. 7 illustrates an interposer that includes one or more embodiments of the disclosure.

FIG. 7 illustrates an interposer 700 that includes one or more embodiments of the present disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials.

The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700 or in the fabrication of components included in the interposer 700.

It is to be appreciated that structures described herein may be operated at a low temperature, e.g., in a range of −77 degrees Celsius to 0 degrees Celsius. In one embodiment, a heat regulator/refrigeration device is coupled to a common board having a device with structures such as those described herein coupled thereto, such as described below in association with FIG. 8A. In one embodiment, a heat regulator device and/or refrigeration device is included on a processing device having structures such as those described herein, such as described below in association with FIG. 8B.

Figure 8A:
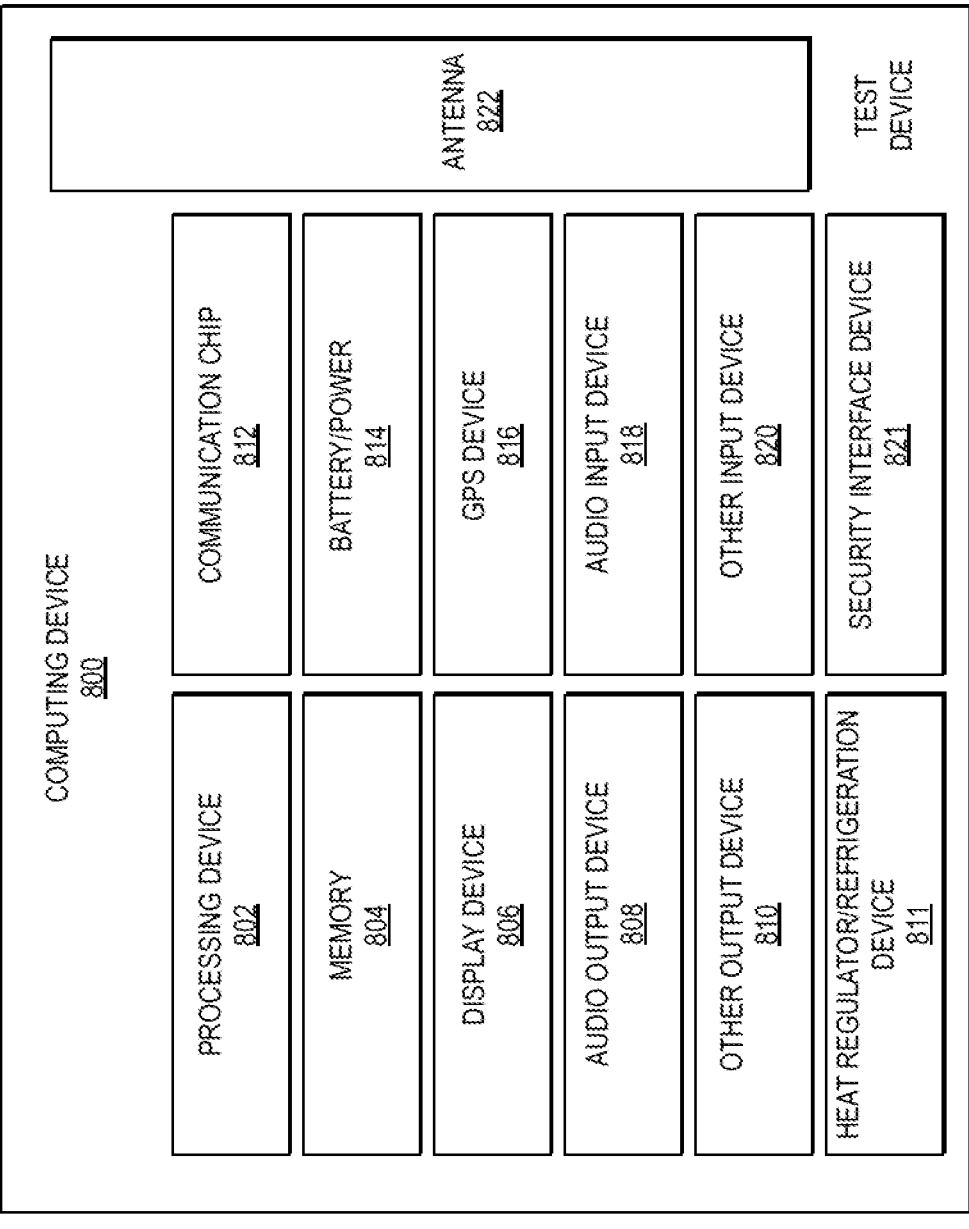
FIG. 8A illustrates a computing device in accordance with one implementation of an embodiment of the present disclosure.

FIG. 8A illustrates a computing device 800 in accordance with one implementation of an embodiment of the present disclosure. The computing device 800 houses a board. The board may include a number of components, including but not limited to a processing device 802. The computing device 800 can also include communication chip 812. In one embodiment, the processing device 802 is physically and electrically coupled to the board. In some implementations the communication chip 812 is also physically and electrically coupled to the board. In further implementations, the communication chip 812 is part of the processing device 802.

Depending on its applications, computing device 800 may include other components that may or may not be physically and electrically coupled to the board. These other components can include, but are not limited to, memory 804, such as volatile memory (e.g., DRAM), non-volatile memory (e.g., ROM), or flash memory, an antenna 822, a display device 806, a battery/power 814, an audio output device 808, an audio input device 818, a global positioning system (GPS) device 816, an other output device 810 (such as video output), and other input device 820 (such as video input), a security interface device 821, and/or a test device. In one embodiment, a heat regulation/refrigeration device 811 is included and is coupled to the board, e.g., a device including actively cooled copper channels.

The communication chip 812 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 812 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 812. For instance, a first communication chip 812 may be dedicated to shorter range wireless communications such as Wi-Fi and Bluetooth and a second communication chip 812 may be dedicated to longer range wireless communications such as GPS, EDGE, GPRS, CDMA, WiMAX, LTE, Ev-DO, and others.

The processing device 802 of the computing device 800 can include an integrated circuit die in a package. The processing device 802 may include one or more structures, such as gate-all-around integrated circuit structures having hybrid interconnect architectures, built in accordance with implementations of embodiments of the present disclosure. The term "processing device" may refer to any device or portion of a device that processes electronic data from registers and/or memory to transform that electronic data into other electronic data that may be stored in registers and/or memory.

Figure 8B:
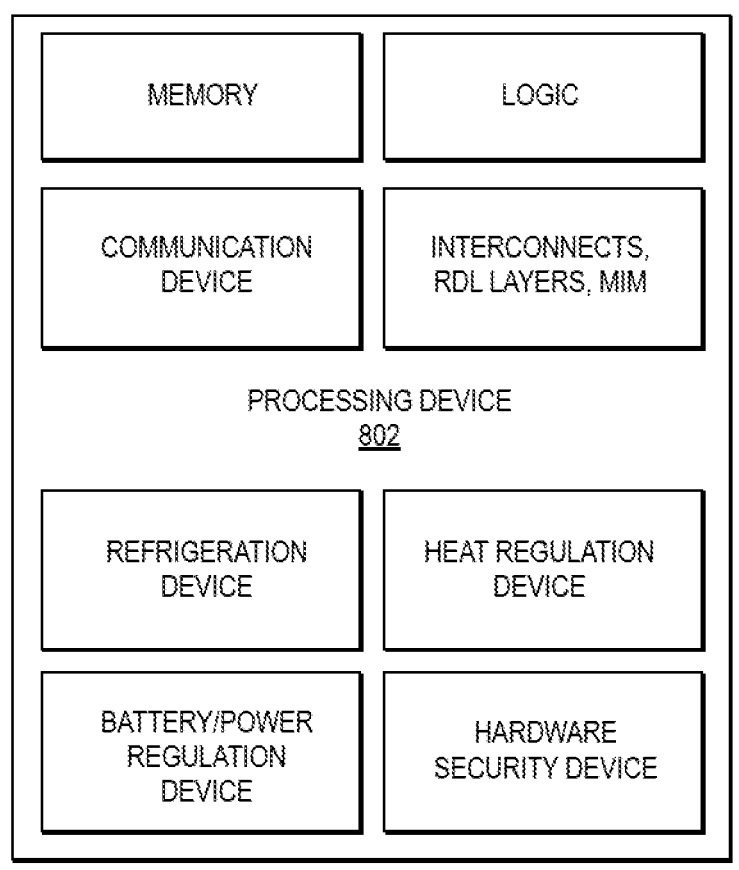
FIG. 8B illustrates a processing device in accordance with one implementation of an embodiment of the present disclosure.

FIG. 8B illustrates a processing device in accordance with one implementation of an embodiment of the present disclosure. Referring to FIG. 8B, an exemplary processing device 802 includes a memory region, a logic region, a communication device region, an interconnects and redistribution layer (RDL) and metal-insulator-metal (MIM) region, a refrigeration device region, a heat regulation device region, a batter/power regulation device region and a hardware security device region. In one embodiment, the refrigeration device region and/or the heat regulation device region is a region including actively cooled copper channels.

Thus, embodiments of the present disclosure include integrated circuit structures having hybrid interconnect architectures, and methods of fabricating integrated circuit structures having hybrid interconnect architectures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: an integrated circuit structure, comprising: an interlayer dielectric (ILD); an opening in the ILD; a first layer that lines the opening; a second layer that lines the first layer, wherein the second layer comprises a semi-metal or transition metal dichalcogenide (TMD); and a third layer over the second layer.

Example 2: the integrated circuit structure of Example 1, wherein the first layer has a first thickness and the second layer has a second thickness, wherein the second thickness is less than the first thickness.

Example 3: the integrated circuit structure of Example 2, wherein the second thickness is less than 2 nm.

Example 4: the integrated circuit structure of Example 2, wherein the first thickness is greater than 1 nm.

Example 5: the integrated circuit structure of Examples 1-4, wherein the first layer and the second layer have U-shaped cross-sections.

Example 6: the integrated circuit structure of Examples 1-5, wherein the first layer comprises a transition metal.

Example 7: the integrated circuit structure of Example 6, wherein the second layer comprises the transition metal and a chalcogenide.

Example 8: the integrated circuit structure of Examples 1-7, further comprising: a fourth layer that lines the third layer; and a fifth layer over the fourth layer.

Example 9: the integrated circuit structure of Example 8, wherein the second layer and the fourth layer comprise the same material.

Example 10: the integrated circuit structure of Example 8, wherein the second layer and the fourth layer comprise different materials.

Example 11: the integrated circuit structure of Examples 1-10, wherein the second layer comprises 10%-20% of the volume of the opening in the ILD.

Example 12: the integrated circuit structure of Examples 1-11, wherein the interconnect is a trace or a pad.

Example 13: the integrated circuit structure of Examples 1-12, wherein the interconnect is a via.

Example 14: an integrated circuit structure, comprising: a device layer; and an interconnect coupled to the device layer, wherein the interconnect comprises: a first layer with a metal, wherein the first layer comprises a U-shaped cross-section; a second layer that lines the first layer, wherein the second layer comprises a semi-metal or transition metal dichalcogenide (TMD); and a third layer over the second layer, wherein the second layer comprises the metal.

Example 15: the integrated circuit structure of Example 14, wherein the interconnect is in a front-side layer of the device layer.

Example 16: the integrated circuit structure of Example 14, wherein the interconnect is in a backside layer of the device layer.

Example 17: the integrated circuit structure of Examples 14-16, wherein the device layer comprises nanowires, nanoribbons, nanosheets, or fins.

Example 18: a computing device, comprising: a board; and a component coupled to the board, the component including an integrated circuit structure, comprising: a device layer comprising nanowire-based transistors, nanoribbon-based transistors, nanosheet-based transistors, or fin-based transistors; and a plurality of metal layers on a backside or a front-side of the device layer, wherein one or more of the metal layers comprises: a bulk metal; and a U-shaped layer embedded in the bulk metal, wherein the U-shaped layer comprises a semi-metal or a transition metal dichalcogenide (TMD).

Example 19: the computing device of Example 18, further comprising: a memory coupled to the board.

Example 20: the computing device of Example 18 or Example 19, further comprising: a communication chip coupled to the board.

What is claimed is:

1. An integrated circuit structure, comprising:
an interlayer dielectric (ILD);
an opening in the ILD;
a first layer that lines the opening;
a second layer that lines the first layer in the opening, wherein the second layer comprises a semi-metal or transition metal dichalcogenide (TMD), and wherein the second layer has an uppermost surface at a same level as an uppermost surface of the first layer; and a third layer over the second layer and within the opening, wherein the third layer has an uppermost surface at a same level as the uppermost surface of the second layer.

2. The integrated circuit structure of claim 1, wherein the first layer has a first thickness and the second layer has a second thickness, wherein the second thickness is less than the first thickness.

3. The integrated circuit structure of claim 2, wherein the second thickness is less than 2 nm.

4. The integrated circuit structure of claim 2, wherein the first thickness is greater than 1 nm.

5. The integrated circuit structure of claim 1, wherein the first layer and the second layer have U-shaped cross-sections.

6. The integrated circuit structure of claim 1, wherein the first layer comprises a transition metal.

7. The integrated circuit structure of claim 6, wherein the second layer comprises the transition metal and a chalcogenide.

8. The integrated circuit structure of claim 1, further comprising:

a fourth layer that lines the third layer; and a fifth layer over the fourth layer.

9. The integrated circuit structure of claim 8, wherein the second layer and the fourth layer comprise the same material.

10. The integrated circuit structure of claim 8, wherein the second layer and the fourth layer comprise different materials.

11. The integrated circuit structure of claim 1, wherein the second layer comprises 10%-20% of the volume of the opening in the ILD.

12. The integrated circuit structure of claim 1, wherein the first layer, the second layer and the third layer form an interconnect, and wherein the interconnect is a trace or a pad.

13. The integrated circuit structure of claim 1, wherein the first layer, the second layer and the third layer form an interconnect, and wherein the interconnect is a via.

14. An integrated circuit structure, comprising:

a device layer; and an interconnect coupled to the device layer, wherein the interconnect comprises:

a first layer with a metal, wherein the first layer comprises a U-shaped cross-section;

a second layer that lines the first layer, wherein the second layer comprises a semi-metal or transition metal dichalcogenide (TMD), and wherein the second layer has an uppermost surface at a same level as an uppermost surface of the first layer; and a third layer over the second layer and within the opening, wherein the third layer has an uppermost surface at a same level as the uppermost surface of the second layer, and wherein the second layer comprises the metal.

15. The integrated circuit structure of claim 14, wherein the interconnect is in a front-side layer of the device layer.

16. The integrated circuit structure of claim 14, wherein the interconnect is in a backside layer of the device layer.

17. The integrated circuit structure of claim 14, wherein the device layer comprises nanowires, nanoribbons, nanosheets, or fins.

18. A computing device, comprising:

a board; and a component coupled to the board, the component including an integrated circuit structure, comprising:

a device layer comprising nanowire-based transistors, nanoribbon-based transistors, nanosheet-based transistors, or fin-based transistors; and a plurality of metal layers on a backside or a front-side of the device layer, wherein one or more of the metal layers comprises:

a bulk metal; and a U-shaped layer embedded in the bulk metal, wherein the U-shaped layer comprises a semi-metal or a transition metal dichalcogenide (TMD).

19. The computing device of claim 18, further comprising:

a memory coupled to the board.

20. The computing device of claim 18, further comprising:

a communication chip coupled to the board.

21. An integrated circuit structure, comprising:

an interlayer dielectric (ILD);

an opening in the ILD;

a first layer that lines the opening;

a second layer that lines the first layer, wherein the second layer comprises a semi-metal or transition metal dichalcogenide (TMD), wherein the first layer has a first thickness and the second layer has a second thickness, wherein the second thickness is less than the first thickness; and a third layer over the second layer.

22. An integrated circuit structure, comprising:

an interlayer dielectric (ILD);

an opening in the ILD;

a first layer that lines the opening;

a second layer that lines the first layer, wherein the second layer comprises a semi-metal or transition metal dichalcogenide (TMD), wherein the first layer and the second layer have U-shaped cross-sections; and a third layer over the second layer.

23. An integrated circuit structure, comprising:

an interlayer dielectric (ILD);

an opening in the ILD;

a first layer that lines the opening;

a second layer that lines the first layer, wherein the second layer comprises a semi-metal or transition metal dichalcogenide (TMD);

a third layer over the second layer;

a fourth layer that lines the third layer, wherein the second layer and the fourth layer comprise the same material; and a fifth layer over the fourth layer.

* * * * *